US010290336B2

(12) United States Patent
Ishibashi et al.

(10) Patent No.: US 10,290,336 B2
(45) Date of Patent: *May 14, 2019

(54) METHODS AND APPARATUSES INCLUDING COMMAND DELAY ADJUSTMENT CIRCUIT

(71) Applicant: Micron Technology, Inc., Boise, ID (US)

(72) Inventors: Shuichi Ishibashi, Tachikawa (JP); Kazutaka Miyano, Sagamihara (JP); Hiroki Fujisawa, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/595,056

(22) Filed: May 15, 2017

(65) Prior Publication Data

US 2017/0309323 A1    Oct. 26, 2017

Related U.S. Application Data

(63) Continuation of application No. 15/139,102, filed on Apr. 26, 2016, now Pat. No. 9,865,317.

(51) Int. Cl.
*G11C 11/4076* (2006.01)
*G11C 7/22* (2006.01)
(Continued)

(52) U.S. Cl.
CPC ............ *G11C 8/18* (2013.01); *G11C 7/1015* (2013.01); *G11C 7/1057* (2013.01);
(Continued)

(58) Field of Classification Search
CPC ... G11C 7/222; G11C 7/1066; G11C 11/4076; G11C 7/225; G11C 7/22; G11C 7/1093
(Continued)

(56) References Cited

U.S. PATENT DOCUMENTS

| 4,644,248 A | 2/1987 | Brennen et al. |
| 5,004,933 A | 4/1991 | Widener |

(Continued)

FOREIGN PATENT DOCUMENTS

| CN | 1952868 A | 4/2007 |
| CN | 101752009 A | 6/2010 |

(Continued)

OTHER PUBLICATIONS

International Search Report and Written Opinion dated Jun. 27, 2017 for PCT application No. PCT/US2017/023594; pp. all.

(Continued)

*Primary Examiner* — Ly D Pham
(74) *Attorney, Agent, or Firm* — Dorsey & Whitney LLP

(57) ABSTRACT

Apparatuses for controlling latencies on input signal paths in semiconductor devices are disclosed. An example apparatus includes: a clock input buffer that provides a reference clock signal and a system clock signal based on an external clock signal; a command decoder that latches command signals with the system clock signal and further provides a signal based on the command signals; and a command delay adjustment circuit including: a clock synchronizing circuit that receives the signal, latches the signal with the system clock signal and provides a clock-synchronized read signal responsive to a shift cycle parameter.

17 Claims, 7 Drawing Sheets

(51) Int. Cl.
*G11C 7/10* (2006.01)
*G11C 8/18* (2006.01)
*G11C 8/10* (2006.01)
*G11C 29/02* (2006.01)

(52) U.S. Cl.
CPC .......... *G11C 7/1069* (2013.01); *G11C 7/1084* (2013.01); *G11C 7/1087* (2013.01); *G11C 7/1093* (2013.01); *G11C 7/1096* (2013.01); *G11C 7/222* (2013.01); *G11C 8/10* (2013.01); *G11C 11/4076* (2013.01); *G11C 29/023* (2013.01); *G11C 29/028* (2013.01); *G11C 7/1066* (2013.01); *G11C 7/22* (2013.01); *G11C 7/225* (2013.01); *G11C 29/024* (2013.01); *G11C 2207/2254* (2013.01); *G11C 2207/2272* (2013.01)

(58) Field of Classification Search
USPC .................... 365/233.1, 233.11, 194, 191
See application file for complete search history.

(56) References Cited

U.S. PATENT DOCUMENTS

| | | |
|---|---|---|
| 5,610,558 A | 3/1997 | Mittel et al. |
| 5,935,253 A | 8/1999 | Conary et al. |
| 6,111,810 A | 8/2000 | Fujita |
| 6,219,384 B1 | 4/2001 | Kliza et al. |
| 6,260,128 B1 | 7/2001 | Ohshima et al. |
| 6,275,077 B1 | 8/2001 | Tobin et al. |
| 6,292,040 B1 | 9/2001 | Iwamoto et al. |
| 6,327,318 B1 | 12/2001 | Bhullar et al. |
| 6,424,592 B1 | 7/2002 | Maruyama |
| 6,438,055 B1 | 8/2002 | Taguchi et al. |
| 6,459,313 B1 | 10/2002 | Godbee et al. |
| 6,489,823 B2 | 12/2002 | Iwamoto |
| 6,510,095 B1 | 1/2003 | Matsuzaki et al. |
| 6,636,110 B1 | 10/2003 | Ooishi et al. |
| 6,687,185 B1 | 2/2004 | Keeth et al. |
| 6,710,726 B2 | 3/2004 | Kim et al. |
| 6,744,285 B2 | 6/2004 | Mangum et al. |
| 6,759,881 B2 | 7/2004 | Kizer et al. |
| 6,781,861 B2 | 8/2004 | Gomm et al. |
| 6,839,288 B1 | 1/2005 | Kim et al. |
| 6,861,901 B2 | 3/2005 | Prexl et al. |
| 6,868,504 B1 | 3/2005 | Lin |
| 6,885,252 B2 | 4/2005 | Hsu |
| 6,914,798 B2 | 7/2005 | Kwon et al. |
| 6,930,955 B2 | 8/2005 | Johnson et al. |
| 6,973,008 B2 | 12/2005 | Krause |
| 6,980,479 B2 | 12/2005 | Park |
| 6,988,218 B2 | 1/2006 | Drexler |
| 7,042,799 B2 | 5/2006 | Cho |
| 7,046,060 B1 | 5/2006 | Minzoni et al. |
| 7,058,799 B2 | 6/2006 | Johnson |
| 7,061,941 B1 | 6/2006 | Zheng |
| 7,065,001 B2 | 6/2006 | Johnson et al. |
| 7,111,185 B2 | 9/2006 | Gomm et al. |
| 7,119,591 B1 | 10/2006 | Lin |
| 7,158,443 B2 | 1/2007 | Lin |
| 7,170,819 B2 | 1/2007 | Szczypinski |
| 7,187,599 B2 | 3/2007 | Schnell et al. |
| 7,209,396 B2 | 4/2007 | Schnell |
| 7,248,512 B2 | 7/2007 | Shin |
| 7,268,605 B2 | 9/2007 | Fang et al. |
| 7,269,754 B2 | 9/2007 | Ramaswamy et al. |
| 7,280,430 B2 | 10/2007 | Lee |
| 7,319,728 B2 | 1/2008 | Bell et al. |
| 7,336,752 B2 | 2/2008 | Vlasenko et al. |
| 7,340,632 B2 | 3/2008 | Park |
| 7,355,464 B2 | 4/2008 | Lee |
| 7,375,560 B2 | 5/2008 | Lee et al. |
| 7,411,852 B2 | 8/2008 | Nishioka et al. |
| 7,428,284 B2 | 9/2008 | Lin |
| 7,443,216 B2 | 10/2008 | Gomm et al. |
| 7,451,338 B2 | 11/2008 | Lemos |
| 7,463,534 B2 | 12/2008 | Ku et al. |
| 7,489,172 B2 | 2/2009 | Kim |
| 7,509,517 B2 | 3/2009 | Matsumoto et al. |
| 7,541,851 B2 | 6/2009 | Gomm et al. |
| 7,580,321 B2 | 8/2009 | Fujisawa et al. |
| 7,590,013 B2 | 9/2009 | Yu et al. |
| 7,593,273 B2 | 9/2009 | Chu et al. |
| 7,609,584 B2 | 10/2009 | Kim et al. |
| 7,616,040 B2 | 11/2009 | Motomura |
| 7,631,248 B2 | 12/2009 | Zakharchenko et al. |
| 7,643,334 B1 | 1/2010 | Lee et al. |
| 7,656,745 B2 | 2/2010 | Kwak |
| 7,660,187 B2 | 2/2010 | Johnson et al. |
| 7,663,946 B2 | 2/2010 | Kim |
| 7,671,648 B2 | 3/2010 | Kwak |
| 7,675,439 B2 | 3/2010 | Chang et al. |
| 7,675,791 B2 | 3/2010 | Kim |
| 7,698,589 B2 | 4/2010 | Huang |
| 7,715,260 B1 | 5/2010 | Kuo et al. |
| 7,716,510 B2 | 5/2010 | Kwak |
| 7,751,261 B2 | 7/2010 | Cho |
| 7,773,435 B2 | 8/2010 | Cho |
| 7,822,904 B2 | 10/2010 | LaBerge |
| 7,826,305 B2 | 11/2010 | Fujisawa |
| 7,826,583 B2 | 11/2010 | Jeong et al. |
| 7,872,924 B2 | 1/2011 | Ma |
| 7,876,640 B2 | 1/2011 | Lin |
| 7,885,365 B2 | 2/2011 | Hagleitner et al. |
| 7,913,103 B2 | 3/2011 | Gold et al. |
| 7,928,782 B2 | 4/2011 | Booth et al. |
| 7,945,800 B2 | 5/2011 | Gomm et al. |
| 7,948,817 B2 | 5/2011 | Coteus et al. |
| 7,969,813 B2 | 6/2011 | Bringivijayaraghavan et al. |
| 7,970,090 B1 | 6/2011 | Tetzlaff |
| 7,983,094 B1 | 7/2011 | Roge et al. |
| 8,004,884 B2 | 8/2011 | Franceschini et al. |
| 8,018,791 B2 | 9/2011 | Kwak |
| 8,030,981 B2 | 10/2011 | Kim |
| 8,115,529 B2 | 2/2012 | Shibata |
| 8,116,415 B2 | 2/2012 | Wada et al. |
| 8,144,529 B2 | 3/2012 | Chuang et al. |
| 8,321,714 B2 | 11/2012 | Wu et al. |
| 8,358,546 B2 | 1/2013 | Kim et al. |
| 8,392,741 B2 | 3/2013 | Kim et al. |
| 8,441,888 B2 | 5/2013 | Bringivijayaraghavan et al. |
| 8,509,011 B2 | 8/2013 | Bringivijayaraghavan |
| 8,536,915 B1 | 9/2013 | Terrovitis |
| 8,644,096 B2 | 2/2014 | Bringivijayaraghavan |
| 8,717,078 B2 | 5/2014 | Idgunji et al. |
| 8,732,509 B2 | 5/2014 | Kwak |
| 8,788,896 B2 | 7/2014 | Tekumalla |
| 9,001,955 B2 | 4/2015 | Lamanna et al. |
| 9,053,815 B2 | 6/2015 | Bell |
| 9,054,675 B2 | 6/2015 | Mazumder et al. |
| 9,166,579 B2 | 10/2015 | Huber et al. |
| 9,329,623 B2 | 5/2016 | Vankayala |
| 9,508,409 B2 | 11/2016 | Kwak |
| 9,529,379 B2 | 12/2016 | Kwak |
| 9,530,473 B2 | 12/2016 | Mazumder |
| 9,531,363 B2 | 12/2016 | Miyano |
| 9,601,170 B1 | 3/2017 | Mazumder et al. |
| 9,865,317 B2 | 1/2018 | Ishibashi et al. |
| 10,193,558 B2 | 1/2019 | Ma et al. |
| 2001/0015924 A1 | 8/2001 | Arimoto et al. |
| 2002/0057624 A1 | 5/2002 | Manning |
| 2002/0110035 A1 | 8/2002 | Li et al. |
| 2002/0149506 A1 | 10/2002 | Altrichter et al. |
| 2003/0117864 A1 | 6/2003 | Hampel et al. |
| 2003/0147299 A1 | 8/2003 | Setogawa |
| 2003/0161210 A1 | 8/2003 | Acharya et al. |
| 2004/0000934 A1 | 1/2004 | Jeon |
| 2004/0008064 A1 | 1/2004 | Kashiwazaki |
| 2004/0041604 A1 | 3/2004 | Kizer et al. |
| 2005/0017774 A1 | 1/2005 | Chow et al. |
| 2005/0024107 A1 | 2/2005 | Takai et al. |
| 2005/0047222 A1 | 3/2005 | Rentschler |
| 2005/0052309 A1 | 3/2005 | Wang |
| 2005/0132043 A1 | 6/2005 | Wang et al. |

(56) References Cited

U.S. PATENT DOCUMENTS

| | | |
|---|---|---|
| 2005/0184780 A1 | 8/2005 | Chun |
| 2005/0270852 A1 | 12/2005 | Dietrich et al. |
| 2006/0033542 A1 | 2/2006 | Lin et al. |
| 2006/0055441 A1 | 3/2006 | McClannahan et al. |
| 2006/0062341 A1 | 3/2006 | Edmondson et al. |
| 2006/0064620 A1 | 3/2006 | Kuhn et al. |
| 2006/0155948 A1 | 7/2006 | Ruckerbauer |
| 2006/0182212 A1 | 8/2006 | Hwang et al. |
| 2006/0193194 A1 | 8/2006 | Schnell |
| 2006/0250861 A1 | 11/2006 | Park et al. |
| 2006/0250883 A1 | 11/2006 | Szczypinski |
| 2007/0033427 A1 | 2/2007 | Correale, Jr. et al. |
| 2007/0046346 A1 | 3/2007 | Minzoni |
| 2007/0086267 A1 | 4/2007 | Kwak |
| 2007/0088903 A1 | 4/2007 | Choi |
| 2007/0192651 A1 | 8/2007 | Schoch |
| 2007/0291558 A1 | 12/2007 | Joo |
| 2008/0042705 A1 | 2/2008 | Kim et al. |
| 2008/0080267 A1 | 4/2008 | Lee |
| 2008/0080271 A1 | 4/2008 | Kim |
| 2008/0082707 A1 | 4/2008 | Gupta et al. |
| 2008/0126822 A1 | 5/2008 | Kim et al. |
| 2008/0137471 A1 | 6/2008 | Schnell et al. |
| 2008/0144423 A1 | 6/2008 | Kwak |
| 2008/0180144 A1 | 7/2008 | Mai |
| 2008/0204071 A1 | 8/2008 | Lee et al. |
| 2008/0232179 A1 | 9/2008 | Kwak |
| 2008/0232180 A1 | 9/2008 | Kim et al. |
| 2008/0253205 A1 | 10/2008 | Park |
| 2009/0041104 A1 | 2/2009 | Bogdan |
| 2009/0219068 A1 | 9/2009 | Mizuhashi et al. |
| 2009/0232250 A1 | 9/2009 | Yamada et al. |
| 2009/0290445 A1 | 11/2009 | Kinoshita et al. |
| 2009/0315600 A1 | 12/2009 | Becker et al. |
| 2010/0001762 A1 | 1/2010 | Kim |
| 2010/0052739 A1 | 3/2010 | Shibata |
| 2010/0054060 A1 | 3/2010 | Ku |
| 2010/0058261 A1 | 3/2010 | Markov et al. |
| 2010/0066422 A1 | 3/2010 | Tsai |
| 2010/0124090 A1 | 5/2010 | Arai |
| 2010/0124102 A1 | 5/2010 | Lee et al. |
| 2010/0128543 A1 | 5/2010 | Kwon et al. |
| 2010/0142308 A1 | 6/2010 | Kim |
| 2010/0165769 A1 | 7/2010 | Kuroki |
| 2010/0165780 A1 | 7/2010 | Bains et al. |
| 2010/0177589 A1 | 7/2010 | Kinoshita |
| 2010/0195429 A1 | 8/2010 | Sonoda |
| 2010/0199117 A1 | 8/2010 | Kwak |
| 2010/0208534 A1 | 8/2010 | Fujisawa |
| 2010/0208535 A1 | 8/2010 | Fujisawa |
| 2010/0232213 A1 | 9/2010 | Hwang et al. |
| 2010/0254198 A1 | 10/2010 | Bringivijayaraghavan et al. |
| 2010/0295584 A1 | 11/2010 | Sano |
| 2010/0327926 A1 | 12/2010 | Takahashi |
| 2011/0026318 A1 | 2/2011 | Franceschini et al. |
| 2011/0047319 A1 | 2/2011 | Jeon et al. |
| 2011/0055671 A1 | 3/2011 | Kim et al. |
| 2011/0057697 A1 | 3/2011 | Miyano |
| 2011/0058437 A1 | 3/2011 | Miyano |
| 2011/0102039 A1 | 5/2011 | Shin |
| 2011/0194575 A1 | 8/2011 | Chen et al. |
| 2011/0228625 A1 | 9/2011 | Bringivijayaraghavan |
| 2011/0238866 A1 | 9/2011 | Zitlaw |
| 2011/0238941 A1 | 9/2011 | Xu et al. |
| 2011/0298505 A1 | 12/2011 | Khoury et al. |
| 2011/0298512 A1 | 12/2011 | Kwak |
| 2011/0304365 A1 | 12/2011 | Bunch |
| 2012/0084575 A1 | 4/2012 | Flores et al. |
| 2012/0124317 A1 | 5/2012 | Mirichigni et al. |
| 2012/0147692 A1 | 6/2012 | Nakamura et al. |
| 2012/0212268 A1 | 8/2012 | Kim |
| 2012/0254873 A1 | 10/2012 | Bringivijayaraghavan |
| 2012/0269015 A1 | 10/2012 | Bringivijayaraghavan |
| 2012/0274376 A1 | 11/2012 | Gomm et al. |
| 2013/0002318 A1 | 1/2013 | Lu et al. |
| 2013/0002320 A1 | 1/2013 | Lin et al. |
| 2013/0141994 A1 | 6/2013 | Ito et al. |
| 2013/0194013 A1 | 8/2013 | Kwak et al. |
| 2013/0250701 A1 | 9/2013 | Bringivijayaraghavan et al. |
| 2013/0321052 A1 | 12/2013 | Huber et al. |
| 2013/0329503 A1 | 12/2013 | Bringivijayaraghavan |
| 2013/0342254 A1 | 12/2013 | Mazumder et al. |
| 2014/0010025 A1 | 1/2014 | Bringivijayaraghavan |
| 2014/0035640 A1 | 2/2014 | Kwak et al. |
| 2014/0055184 A1 | 2/2014 | Vankayala |
| 2014/0119141 A1 | 5/2014 | Tamlyn et al. |
| 2014/0176213 A1 | 6/2014 | Rylov |
| 2014/0177359 A1 | 6/2014 | Kumar et al. |
| 2014/0177361 A1 | 6/2014 | Kitagawa |
| 2014/0258764 A1 | 9/2014 | Kwak |
| 2014/0293719 A1 | 10/2014 | Jung |
| 2014/0340158 A1 | 11/2014 | Thandri et al. |
| 2015/0097604 A1 | 4/2015 | Taniguchi |
| 2015/0156009 A1 | 6/2015 | Bogdan |
| 2015/0170725 A1 | 6/2015 | Kwak |
| 2015/0235691 A1 | 8/2015 | Kwak |
| 2015/0263739 A1 | 9/2015 | Jung et al. |
| 2015/0263740 A1 | 9/2015 | Jung et al. |
| 2015/0340072 A1 | 11/2015 | Mazumder |
| 2016/0013799 A1 | 1/2016 | Li et al. |
| 2016/0056807 A1 | 2/2016 | Neidengard et al. |
| 2016/0322964 A1 | 11/2016 | Miyano |
| 2016/0365860 A1 | 12/2016 | Ma et al. |
| 2017/0288682 A1 | 10/2017 | Ma et al. |
| 2017/0309320 A1 | 10/2017 | Ishibashi et al. |
| 2018/0053538 A1 | 2/2018 | Miyano et al. |
| 2018/0286470 A1 | 10/2018 | Miyano et al. |
| 2018/0358064 A1 | 12/2018 | Ishibashi et al. |

FOREIGN PATENT DOCUMENTS

| | | |
|---|---|---|
| JP | 2013-222997 A | 10/2013 |
| TW | 201303735 | 1/2013 |
| WO | 2017189127 A1 | 11/2017 |
| WO | 2018038835 A1 | 3/2018 |

OTHER PUBLICATIONS

U.S. Appl. No. 15/243,651, entitled "Apparatuses and Methods for Adjusting Delay of Command Signal Path", filed Aug. 22, 2016.

"Interfacing DDR SDRAM with Stratix II Devices", Version 3.2, Altera Corp, Sep. 2008.

Lee, "How to implement DDR SGRAM in Graphic System", Samsung Electric, 4Q1998 (Oct.-Dec. 1998).

U.S. Appl. No. 16/286,829, titled "Apparatuses and Methods for Indirectly Detecting Phase Variations" filed Feb. 27, 2019, pp. all.

METHODS AND APPARATUSES INCLUDING COMMAND DELAY ADJUSTMENT CIRCUIT

CROSS-REFERENCE TO RELATED APPLICATIONS

This application is a continuation of U.S. application Ser. No. 15/139,102, filed Apr. 26, 2016, issued as U.S. Pat. No. 9,865,317 on Jan. 9, 2018. The afore-mentioned application and patent are incorporated herein by reference, in their entirety, for any purpose.

BACKGROUND

High data reliability, high speed of memory access, and low power consumption are features that are demanded from semiconductor memory. In recent years, there has been an effort to further increase the speed of memory access. Many synchronous integrated circuits in a semiconductor device perform operations based on a clock signal to meet critical timing requirements.

In order to assess performance of a pulse-signal transmission system, a window or "data eye" pattern may be evaluated. The data eye for each of the data signals defines the actual duration that each signal is valid after various factors affecting the signal are considered, such as timing skew, voltage and current drive capability, for example. In the case of timing skew of signals, it often arises from a variety of timing errors such as loading on the lines of the bus and the physical lengths of such lines. For example, a rank margining test (RMT) may be used to evaluate the window in order to assess performance tolerance of an input buffer in a semiconductor device. In the RMT, a reference voltage (VREF) level may be varied from a mid-point between a voltage of input high (VIH) and a voltage of input low (VIL) to test a margin of RMT as performance tolerance. The input buffer is required to operate without any errors even if the reference voltage shifts, as long as the reference voltage is in a predetermined range.

FIG. 1 is a block diagram of an apparatus 100 including a command delay adjustment circuit 130. The apparatus 100 may include a clock input buffer 110, a command input buffer 111, a command decoder circuit 120, the command delay adjustment circuit 130, signal trees 190 and 191 for a command signal and a clock signal, and an output buffer 195.

The command delay adjustment circuit 130 may include a DLL clock path and a command path. The DLL clock path may include a command replica 121, and a delay line 141 for the clock signal. The command replica 121 replicates a delay of the command decoder circuit 120 in providing an RdClk signal responsive to command signals CMD and a system clock signal SCLK_CMD signals. The command replica 121 may delay a SCLK_DLL signal and provide a delayed system clock signal SCLKD to the delay line 141. The command path includes a delay line 140 for the command signal and a dQ-Enable-Delay (QED) circuit 160. The command delay adjustment circuit 130 further includes a replica of the DLL clock path 151, a phase detector 170 and a DLL control circuit 180 which form a DLL circuit together with the delay line 141 for the clock signal.

The command delay adjustment circuit 130 may synchronize an output signal of the dQ-Enable-Delay circuit 160 with a DLL clock signal DllClk from the delay line 141 while providing a latency on the output signal of the dQ-Enable-Delay circuit 160. The latency here is, for example, a column address strobe (CAS) latency (CL), which may be set based on a clock frequency of the clock signal CK. The CL value may account for a delay time between when a memory receives a READ command and when the output buffer 195 provides read data responsive to the READ command to an output bus (e.g., via a DQ pad after the output buffer 195). The CL value may be represented as a number of clock cycles. One clock cycle can be represented by T.

However, there are side effects that increase jitter of the SCLKD signal from the command replica 121, and increased active standby current (e.g., IDD3N). In turn, the jitter in the SCLKD signal increases jitter of the DLL clock signal DllClk, which causes the decrease of the margin of RMT. Thus, higher speed of memory access enabled by adding the command replica 121 may cause a decrease in the margin of RMT, accompanied with higher power consumption.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
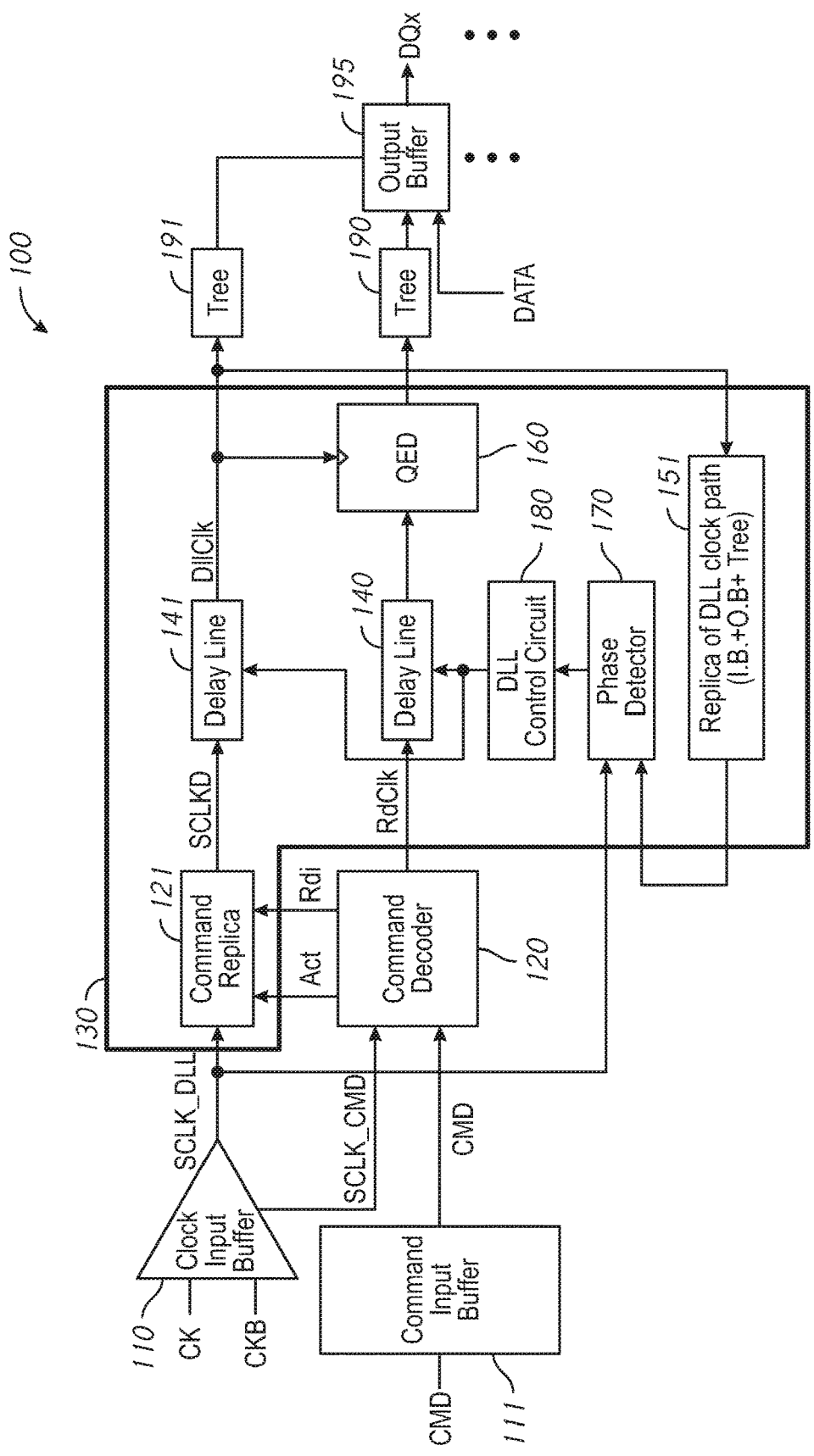
FIG. 1 is a block diagram of an apparatus including a command delay adjustment circuit in read operation.
Figure 2:
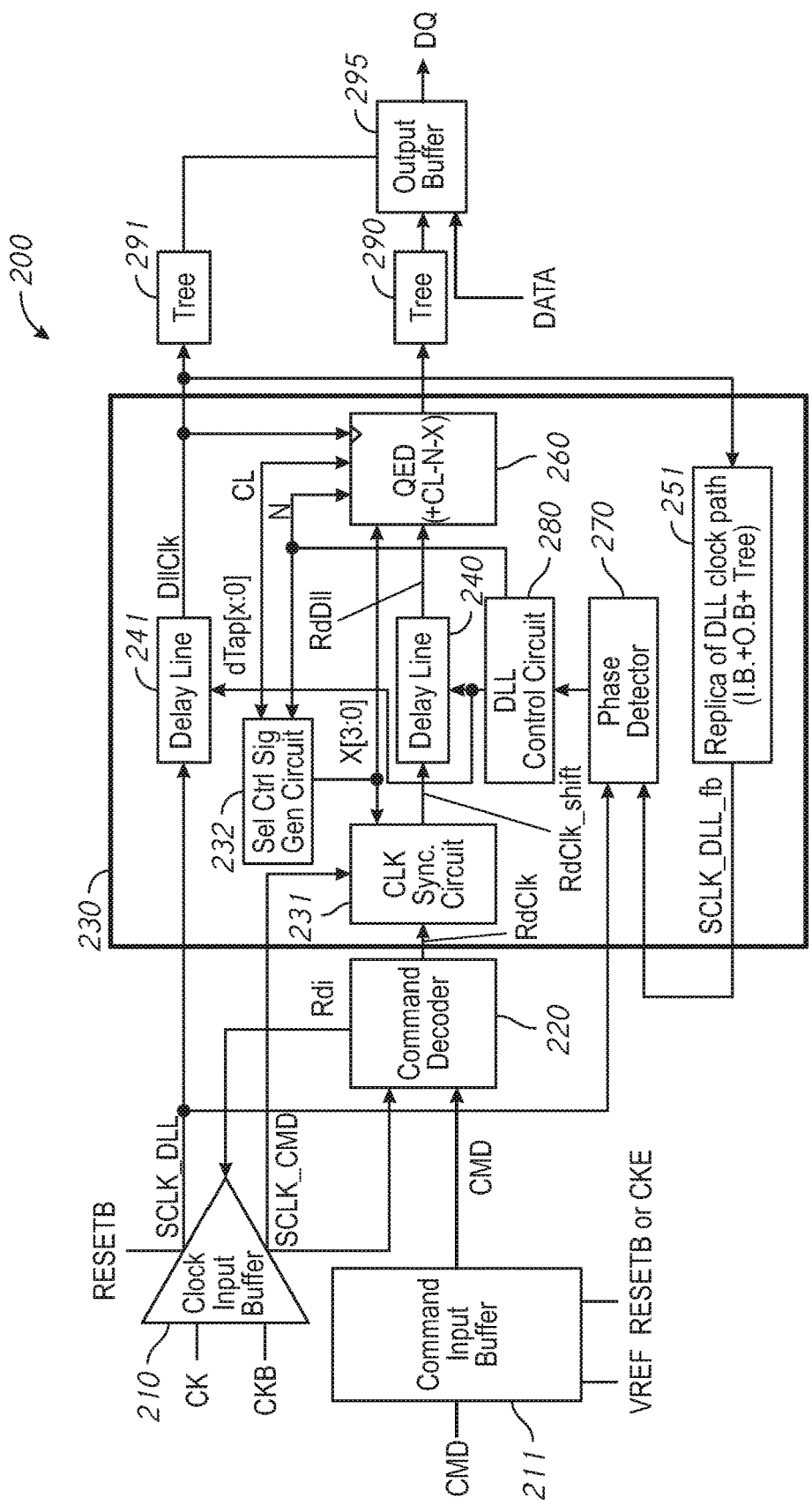
FIG. 2 is a block diagram of an apparatus including a command delay adjustment circuit in accordance with an embodiment of the present disclosure.

FIG. 2 is a block diagram of an apparatus 200 including a command delay adjustment circuit 230 in accordance with an embodiment of the present disclosure. The apparatus 200 may include a clock input buffer 210, a command input buffer 211, a first circuit 220 (which may also be referred to herein as a command decoder circuit), the command delay adjustment circuit 230, signal trees 290 and 291 for a command signal and a clock signal and an output buffer 295. The clock input buffer 210 receives a clock signal CK, a complementary clock signal CKB both of which are external clock signals, and further receives a complementary reset signal RESETB. The clock input buffer 210 further receives an enable signal Rdi based on a READ command from the command decoder circuit 220. The clock input buffer 210 may provide a system clock signal SCLK_CMD and a reference clock signal SCLK_DLL responsive, at least in part, to the clock signal CK and a complementary clock signal CKB. The system clock signal SCLK_CMD and the reference clock signal SCLK_DLL may be synchronized with each other or be in phase to each other. The clock input buffer 210 may enable or disable providing the reference clock signal SCLK_DLL, at least partly responsive to the enable signal Rdi. The command input buffer 211 receives a first signal (which may also be referred to herein as a command signal CMD), a reference voltage VREF and either the complementary signal RESETB or a clock enable signal CKE. The command input buffer 211 provides the command signal CMD to the command decoder circuit 220. The command decoder circuit 220 receives the system clock signal SCLK_CMD and the command signal CMD. The command decoder circuit 220 decodes the commands on the command signal CMD, responsive to the system clock signal SCLK_CMD to provide a pulse on a second signal (which may also be referred to herein as a command delay line input signal RdClk). As earlier described, the command decoder circuit 220 may provide the enable signal Rdi responsive to a command signal for a READ operation.

The command delay adjustment circuit 230 may include a DLL clock path and a command path. The DLL clock path may include a delay line circuit 241 for the clock signal. The command path includes a second circuit 231 (which may also be referred to herein as a clock synchronizing circuit), a delay line circuit 240 for the command signal and a third circuit 260 (which may also be referred to herein as a QED circuit). The command delay adjustment circuit 230 further includes a selector control signal generator circuit 232, a replica of the DLL clock path 251, a phase detector 270 and a delay control circuit 280 (which may also be referred to herein as a DLL control circuit). The replica of the DLL clock path 251, the phase detector 270 and the DLL, control circuit 280 form a DLL circuit together with the delay line 241 for the clock signal. The clock synchronizing circuit 231 receives a command delay line input signal RdClk from the command decoder circuit 220, the system clock signal SCLK_CMD from the dock input buffer 210, and a shift cycle parameter X (X[3:0]) from the selector control signal generator circuit 232. The clock synchronizing circuit 231 is provided to absorb a time lag tDec due to command decoding and latching in the command decoder circuit 220. The clock synchronizing circuit 231 synchronizes rising edges of the command delay line input signal RdClk with rising edges of the system clock signal SCLK_CMD, and provides a third signal (which may also be referred to herein as a clock-synchronized read signal RdClk_shift). The selector control signal generator circuit 232 may provide the shift cycle parameter X (X[3:0]) to the clock synchronizing circuit 231 and the QED circuit 260. The shift cycle parameter X represents a number of clock cycles to shift (e.g., maximum three clock cycles in this embodiment) for absorbing the time lag tDec. In some embodiment, the shift cycle parameter X may represent more than three clock cycles. The selector control signal generator circuit 232 receives an N value that may be described later in detail from the DLL control circuit 280 and a predetermined CL value which may be frequency dependent value, and provides the shift cycle parameter X (X[3:0]) in a DLL reset sequence or in a DLL update sequence by assigning an extra period "CL-N" to X with a subtractor.

The delay lines 240 and 241 include adjustable delay circuits. The delay line 240 receives the clock-synchronized read signal RdClk-shift and a tap signal (dTap[x:0]) from the DLL control circuit 280 and provides a fourth signal (which may also be referred to herein as a delayed read signal RdDll). The DLL control circuit 280 further provides the N value which represents a timing relationship between the reference clock signal SCLK_DLL and a feedback clock signal SCLK_DLL_fb, that may be a number of clock cycles to achieve a locked condition in which the reference clock signal SCLK_DLL and the feedback clock signal SCLK_DLL_fb are in phase to each other. The N value may be provided to the selector control signal generator circuit 232 and the QED circuit 260 after reaching the locked condition. The QED circuit 260 synchronizes the delayed read signal RdDll from the delay line 240 with the DLL clock signal DllClk from the delay line 241. The QED circuit 260 adjusts a latency of the delayed read signal RdDll using the N value and the CL value as well as the shift cycle parameter X. The QED circuit 260 provides a fifth signal (which may also be referred to herein as a read activation signal).

The phase detector 270 detects a phase difference between the feedback clock signal SCLK_DLL_fb through the model delays and the reference signal SCLK_DLL and provide the detected phase difference to the DLL control circuit 280. Based on the phase difference between the reference signal SCLK_DLL and the feedback clock signal SCLK_DLL_fb, the DLL control circuit 280 may adjust the delays of the delay lines 240 and 241 so that rising edges of the feedback clock signal SCLK_DLL_fb and rising edges of the reference clock signal SCLK_DLL are synchronized. The DLL control circuit 280 controls the delay lines 240 and 241 to have substantially the same delay. To provide a latch margin between the DLL clock signal DllClk from the delay line 241 and the delayed read signal RdDll in the QED circuit 260, the rising edges of the reference clock SCLK_DLL and rising edges of the clock-synchronized read signal RdClk_shift are controlled to synchronize before the delay line 240. By including the clock synchronizing circuit 231, the two delay lines 240 and 241 can use an identical tap signal dTap[x:0] to have the same delay. Thus, the rising edge timings of the reference clock signal SCLK_DLL and the rising edges of the clock-synchronized read signal RdCll_shift can be synchronized by adding the clock synchronizing circuit 231 on the command path for data transmission.

Figure 3:
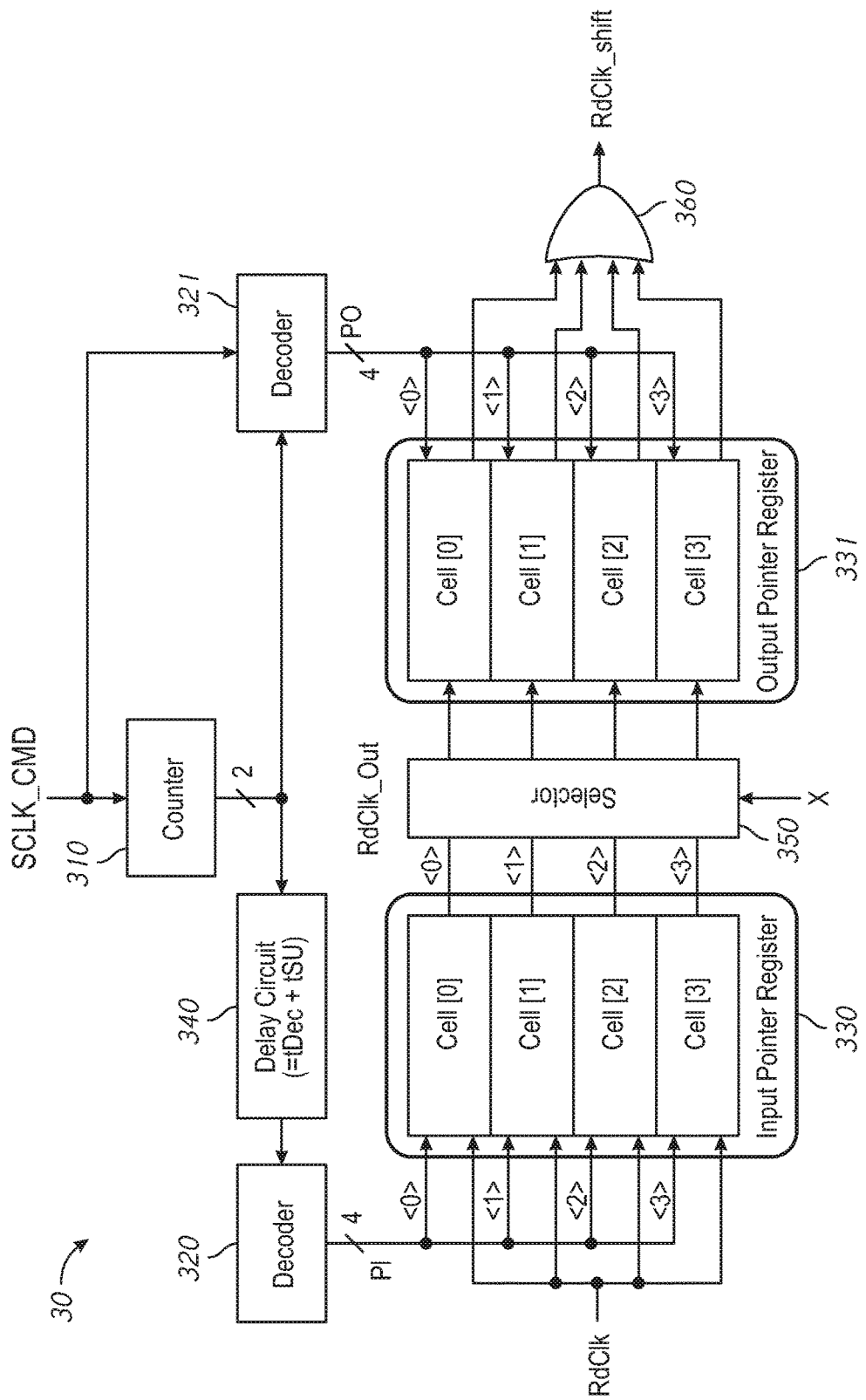
FIG. 3 is a block diagram of a clock synchronizing circuit in accordance with an embodiment of the present disclosure.

FIG. 3 is a block diagram of a clock synchronizing circuit in accordance with an embodiment of the present disclosure. For example, the clock synchronizing circuit 30 may be the clock synchronizing circuit 231 on the command path in FIG. 2. The clock synchronizing circuit 30 is a first-in-first-out (FIFO) circuit which receives a command delay line input signal RdClk, a system clock signal SCLK_CMD, and a shift cycle parameter X (X[3:0]). The clock synchronizing circuit 30 includes a counter circuit 310, a plurality of decoder circuits 320 and 321, an input pointer register 330 including a plurality of cells and an output pointer register 331 including a plurality of cells. The plurality of decoders 320 and 321 may be four-bit decoders. A FIFO clock signal may be generated by using the counter circuit 310. In some embodiments, the counter circuit 310 may be a Gray code counter, however, in other embodiments other types of counters may be used as the counter circuit 310. In this embodiment, the counter circuit 310 may be a two bits counter circuit and shared between the input pointer register 330 and the output pointer register 331. The clock synchronizing circuit 30 may also include a delay circuit 340 at an output node of the counter circuit 310 which provides the delayed counter signal to the decoder circuit 320 responsive to an output signal of the counter circuit 310. The delay circuit 340 may compensate a latency between the system clock signal SCLK_CMD and the command delay line input signal RdClk that is equivalent to a sum of "tDec+NU" where tSU is a set up time of the command delay line input signal RdClk and tDec is a time delay due to command decoding and latching in the command decoder circuit 220. The delay circuit 340 is on the command path, not on a DLL clock path, thus the delay circuit 340 does not increase jitter in the reference clock signal SCLK_DLL, which may improve a margin of RMT.

Each cell of the input pointer register 330 may include two latches for lower power consumption, as will be described in more detail later. The cells of the input pointer register 330 may be flip-flops in other embodiments. For example, each of the cells [0]-[3] of the input pointer register 330 receives a corresponding pointer input signal PI<0>-<3> from the decoder circuit 320, as well as the command delay line input signal RdClk. For example, each of the cells [0]-[3] of the input pointer register 330 may receive the command delay line input signal RdClk responsive to an activation of the corresponding pointer input signal PI<0>-<3>. The cells [0]-[3] of the input pointer register 330 provide output signals, such as pointer signals RdClk_Out<0>-<3> to the selector 350. The selector 350 receives the shift cycle parameter X (X[3:0]) as a selector control signal and selects a path responsive to the shift cycle parameter X (X[3:0]). The cells of the output pointer register 331 may be flip-flops. The decoder circuit 321 receives the system clock signal SCLK_CMD and the output signals from the counter circuit 310 and provides a plurality of corresponding pointer output signals PO<0>-<3> to the cells [0]-[3] of the output pointer register 331. The cells [0]-[3] of the output pointer register 331 receive signals from the selector 350 by selectively coupling one cell of the input pointer register 330 to a corresponding cell of the output pointer register 331 responsive to the shift cycle parameter X and the pointer output signals PO<0>-<3>. The output pointer register 331 provides a clock-synchronized read signal RdClk_shift responsive to the signals from the selector 350 and the pointer output signals PO<0>-<3> through an OR circuit 360. For example, each of the cells [0]-[3] of the output pointer register 331 may provide the clock-synchronized read signal RdClk shift responsive to an activation of the corresponding pointer output signals PO<0>-<3>. The clock-synchronized read signal RdClk_shift may be provided to a delay line, for example, to the delay line 240 of FIG. 2. The clock-synchronized read signal RdClk shift may be synchronized with SCLK_CMD signal.

Figure 4A:
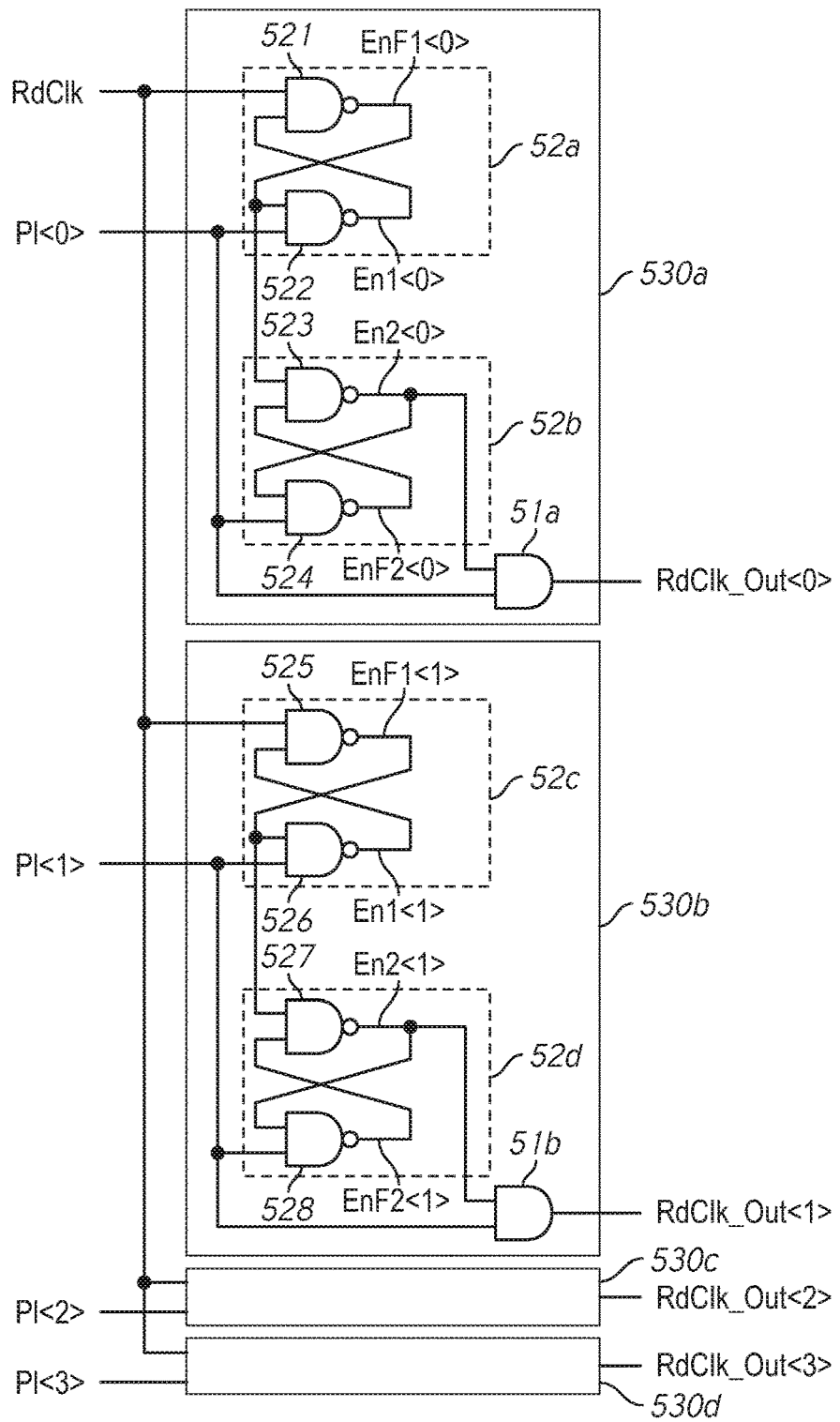
FIG. 4A is a diagram of cells of an input pointer register in a clock synchronizing circuit in accordance with an embodiment of the present disclosure.

FIG. 4A is a diagram of cells of an input pointer register in a clock synchronizing circuit in accordance with an embodiment of the present disclosure. A cell [0] 530a, a cell 530b, a cell [2] 530c and a cell [3] 530d may be the cells [0]-[3] of the input pointer register 330 in the clock synchronizing circuit 30 of FIG. 3. The cells 530a, 530b, 530c and 530d may receive a command delay line input signal RdClk and may further provide pointer signals RdClk_Out<0>-<3> responsive to pointer input signals PI<0>-PI<3>, respectively. Each of the cells 530a, 530b, 530c and 530d includes two latches. For example, the cell [0] 530a includes an AND gate 51a and latches 52a and 52b. The latch 52a may include two NAND gates 521 and 522 and the latch 52b may include two NAND gates 523 and 524.

Similarly, the cell [1] 530b includes an AND gate 51b and latches 52c and 52d. The latch 52c may include two NAND gates 525 and 526 and the latch 52d may include two NAND gates 527 and 528.

Figure 4B:
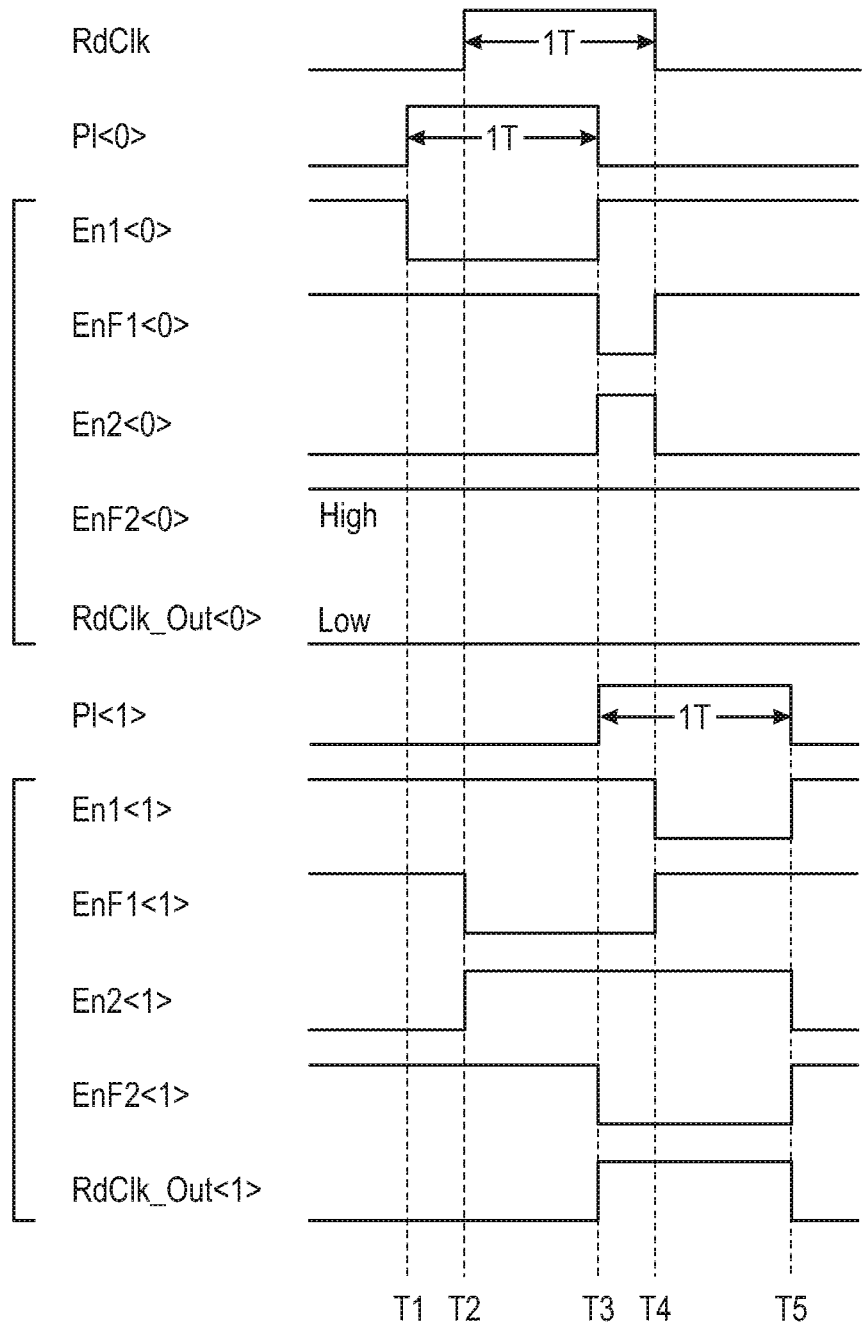
FIG. 4B is a timing diagram of signals in cells of the input pointer register of FIG. 4A, in accordance with an embodiment of the present disclosure.

FIG. 4B is a timing diagram of signals in cells of the input pointer register of FIG. 4A, in accordance with an embodiment of the present disclosure. The pointer input signals PI<0>-PI<3> are a pulse signal having a pulse width 1T of command delay line input signal RdClk, where T is one clock cycle. The pointer input signals PI<0>-PI<3> are activated alternatively, in an order of PI<0>, PI<1>, PI<2>, PI<3>, and are provided by a decoder circuit, such as the decoder circuit 320 in FIG. 3.

For example, the cell [0] 530a receives the pointer input signal PI<0>. The NAND gate 522 in the latch 52a provides a signal En1<0> having a falling edge and a rising edge responsive to a rising edge and a falling edge of the pointer input signal PI<0> at time T1 and time 113, respectively, while a signal EnF1<0>, an output signal of the NAND gate 521, is inactive (e.g., at a logic low level). The NAND gate 521 provides a signal EnF1<0> having a falling edge responsive to the rising edge of the signal En1<0> at the time T3 and having a rising edge responsive to a falling edge of the command delay line input signal RdClk at time T4.

A signal En2<0> and the pointer input signal PI<0> are provided to the NAND gate 524 in the latch 52b. The NAND gate 524 in the latch 52b provides a signal EnF2<0> which is active (e.g., at a logic high level), responsive to the logic low level of the signal En2<0>, an output signal of the NAND gate 523, until the time 13 and further responsive to the logic low level of the pointer input signal PI<0> from the time T3. The NAND gate 523 in the latch 52b provides the signal En2<0> having a rising edge and a falling edge responsive to a falling edge and a rising edge of the signal EnF1<0> at the time T3 and the time T4 respectively, while the signal EnF2<0> is active (e.g., at the logic high level "High"). The AND gate 51a receives the pointer input signal PI<0> and the signal En2<0> and provides a pointer signal RdClk_Out<0> which is inactive (e.g., at the logic low level "Low").

At the same time, the cell [1]530b receives a pointer input signal PI<1>. The NAND gate 526 in the latch 52c provides a signal En1<1> having a falling edge responsive to the falling edge of the command delay line input signal RdClk at the time T4 and having a rising edge responsive to a falling edge of the pointer input signal PI<1> at time T5. The NAND gate 525 provides a signal EnF1<1> having a falling edge and a rising edge responsive to the rising edge and falling edge of the command delay line input signal RdClk at the time T2 and the time 14, respectively, while the signal En1<1> active (e.g., at the logic high level) until the time T4. A signal En2<1> and the pointer input signal PI<1> are provided to the NAND gate 528 in the latch 52d. The NAND gate 528 in the latch 52d provides a signal EnF2<1> having a falling edge and a rising edge responsive to the rising edge and the falling edge of the pointer input signal PI<1> at the time T3 and the time T5, respectively. The NAND gate 527 in the latch 52d provides the signal En2<1> having a rising edge responsive to the falling edge of the signal ErF1<1> and having a falling edge responsive to the rising edge of the signal EnF2<1>. The AND gate 51b receives the pointer input signal PI<1> and the signal En2<1> and provides a pointer signal RdClk_Out<1> that has a rising edge at the time T3 and a falling edge at the time T5.

Thus, the command delay line input signal RdClk may be captured by the pointer input signal PI<1> in the example of FIG. 4B. As described above, the latch 52a and the latch 52c capture the command delay line input signal RdClk by rising edges of the pointer input signals PI<0> and <1>, and the latch 52b and the latch 52d provide the pulse width 1T.

Figure 5:
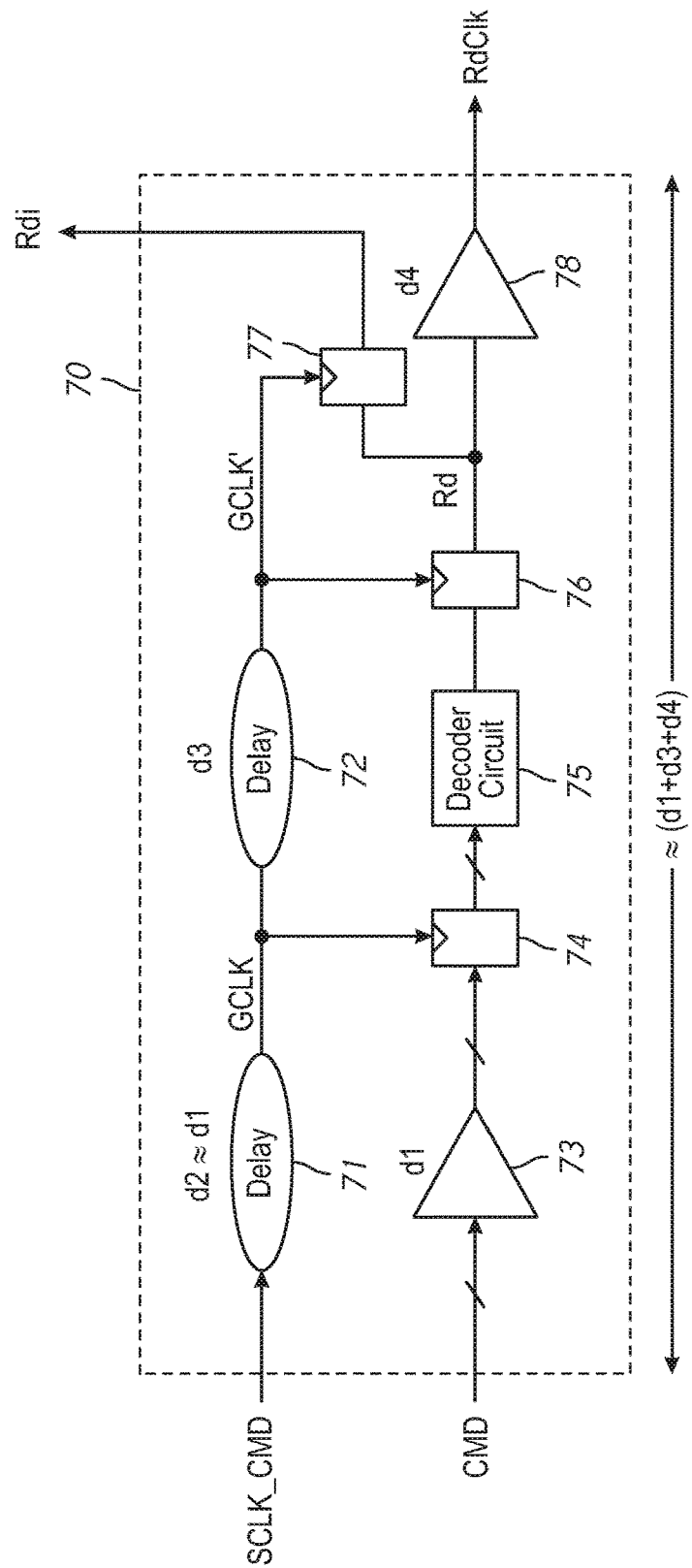
FIG. 5 is a circuit diagram of a command decoder circuit in an apparatus including a command delay adjustment circuit, in accordance with an embodiment of the present disclosure.

FIG. 5 is a circuit diagram of a command decoder circuit in an apparatus including a command delay adjustment circuit, in accordance with an embodiment of the present disclosure. The command decoder circuit 70 may latch commands on the command signals CMD with a clock signal GCLK based on the system clock signal SCLK_CMD before and after command decoding. In the command decoder circuit 70, the command signals CMD are provided to a buffer gate 73 that has a delay d1. The system clock signal SCLK_CMD is provided to a delay 71 to provide a delay d2, which is approximately equal to the delay d1 of the buffer gate 73, and the delay 71 provides the clock signal GCLK. A flip-flop 74 latches the delayed command signals from the buffer gate 73 with the clock signal GCLK. Output signals from the flip-flop 74 are provided to a decoder circuit 75. The decoder circuit 75 may decode the command based on the output signals from the flip-flop 74 and provides a signal, for example, a read signal, responsive to the output signals. A flip-flop 76 latches the signal from the decoder circuit 75 with the clock signal GCLK' and provides an internal read signal Rd. A delay 72 having a delay d3 receives the clock signal GCLK and provides a clock signal GCLK'. The delay d3 of the delay 72 may be equivalent to delays caused through the flip-flop 74, the decoder circuit 75 and the flip-flop 76. A flip-flop 77 latches the internal read signal Rd with the clock signal GCLK' and provides the enable signal Rdi to the clock input buffer 210. A buffer gate 78 having a delay d4 receives the internal read signal Rd and provides the command delay line input signal RdClk to the clock synchronizing circuit 231 of the command delay adjustment circuit 230 in FIG. 2. Thus, the time lag tDec, which is about a sum of the delays d1, d3 and d4, is provided to the command delay line input signal RdClk. The clock synchronizing circuit 231 is configured to absorb the time lag provided to the command delay line input signal RdClk.

Figure 6:
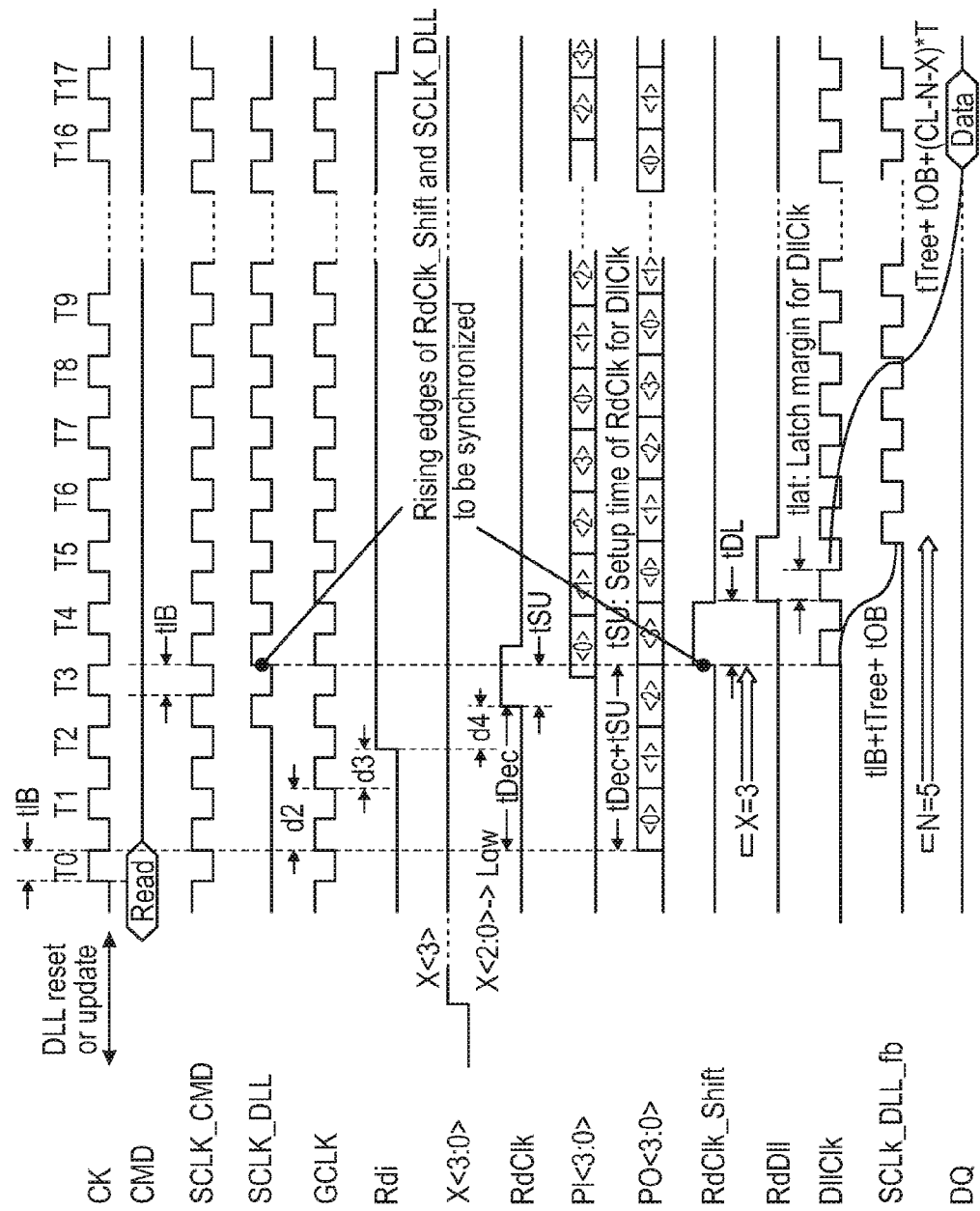
FIG. 6 is a timing diagram of signals in an apparatus including a command delay adjustment circuit, in accordance with an embodiment of the present disclosure.

FIG. 6 is a timing diagram of signals in an apparatus including a command delay adjustment circuit, in accordance with an embodiment of the present disclosure. After a DLL is reset or updated, the clock signal CK is provided to the clock input buffer 210 of the apparatus 200 in FIG. 2. The clock signal CK is clock pulse signal including rising edges at T0, T1, T2, T3, T4, T5, T6, T7, T8, T9, . . . , T16, T17 and so on. The clock input buffer 210 provides the system clock signal SCLK_CMD having a delay tIB at the clock input buffer 210 responsive to the clock signal CK. When a READ command is issued at T0, the command input buffer 211 receives the READ command on command signals MD and provides the command signals CMD to the command decoder circuit 220. The system clock signal SCLK_CMD has a rising edge with the delay tIB responsive to the rising edge of the clock signal CK at T0. A rising edge of the clock signal GCLK has the delay d2 from the rising edge of the system clock signal SCLK_CMD, due to the delay 71, equivalent to the delay d1 at the buffer gate 73, in FIG. 5. The enable signal Rdi has a rising edge with the delay d3 from the rising edge of clock signal GCLK. The command delay line input signal RdClk has a delay d4 from the enable signal Rdi caused by the buffer gate 78. Thus, the command delay line input signal RdClk has a delay of "tDec(=d2+d3+d4)." The enable signal Rdi may be reset by a burst end signal (not illustrated) after a read operation. In the clock synchronizing circuit 30, the delay circuit 340 provides a delay of "tDec+tSU" to the pointer input signals PI<3:0> from the system clock signal SCLK_CMD. In the timing diagram of FIG. 6, the pointer input signal PI<0> has the delay of "tDec+tSU" from the rising edge of the system clock signal SCLK_CMD at T0. Thus, the pointer input signal PI<0> has the delay tSU from the command delay line input signal RdClk that is a set up time of the command delay line input signal RdClk.

For example in the timing diagram of FIG. 6, a shift cycle parameter X in this example is three, which means that the RdClk_shift signal has a three-cycle delay from a corresponding pulse of the system clock signal SCLK_CMD. The pointer output signal PO<3> is activated just after the activation of the pointer input signal PI<0>. The pointer output signals PO<2>-PO<0> may maintain an inactive state (e.g., at the logic low level). Thus, the RdClk_shift signal is activated responsive to the pointer output signal PO<3>. The feedback clock signal SCLK_DLL_fb has a sum of a delay tIB at the clock input buffer 210, a delay tTREE at the TREE 290 and a delay tOB at the output buffer 295 from the DllClk. The N value in this example is five, which means that the feedback clock signal SCL_DLL_fb signal has a five-cycle delay from the corresponding pulse of the system clock signal SCLK_CMD. For example, the delayed read signal RdDll is latched with the falling edge of the DLL clock signal DllClk in the QED circuit 260 after the delay line 240 having a delay tDL. To ensure a latch margin "tlat" between the DLL clock signal DllClk and the delayed read signal RdDll in the QED circuit 260, the rising edges of the reference clock signal SCLK_DLL and rising edges of the clock-synchronized read signal RdClk_shift can be in synchronized by the clock synchronizing circuit 231 as described earlier. The QED circuit 260 synchronizes the delayed read signal RdDll with the DLL clock signal DllClk by shifting the delayed read signal RdDll by a total of (CL−N−X) cycles. Thus, output data on DQ signal has a delay that is a total of "tTree+tOB+(CL−N−X)*T" from the DLL clock signal DllClk.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a first circuit configured to respond to a first clock signal to latch a first signal, the first circuit being configured to provide a second signal;
   a second circuit coupled to the first circuit to latch the second signal, the second circuit being configured to provide a third signal based on the second signal in response to a first output timing signal that is substantially in phase to the first clock signal; and
a clock input buffer circuit configured to generate the first clock signal in response to an enable signal,
wherein the first circuit is coupled to the clock input buffer circuit and further configured to provide the enable signal to the clock input buffer.

2. The apparatus as claimed in claim 1, wherein the first circuit is configured to decode the first signal to provide the second signal.

3. The apparatus as claimed in claim 2, wherein the first circuit is a command decoder circuit and the first signal includes a command signal.

4. The apparatus as claimed in claim 1, further comprising:
a first delay circuit configured to receive a second clock signal that is substantially in phase to the first clock signal and further configured to provide a third clock signal by delaying the second clock signal by a first delay that is adjustable;
a second delay circuit coupled to the second circuit and configured to provide a fourth signal by delaying the third signal by a second delay that is adjustable; and
a delay control circuit configured to adjust the first delay of the first circuit and the second delay of the second delay circuit to be substantially equal to each other.

5. The apparatus as claimed in claim 4, further comprising:
a third circuit coupled to the second delay circuit and configured to provide a fifth signal by delaying the fourth signal in response to the third clock signal and latency information; and
an output buffer coupled to the third circuit and configured to be activated in response to the fifth signal and further configured to operate in response to the third clock signal.

6. The apparatus as claimed in claim 1, wherein the second circuit is further configured to latch the second signal in response to a first input signal that is delayed in phase from the first clock signal.

7. The apparatus as claimed in claim 6,
wherein the second circuit further comprises:
a counter circuit configured to receive the first clock signal and further configured to provide a plurality of timing control signals in response to the first clock signal;
a third delay circuit coupled to the counter circuit and configured to provide a plurality of second input timing signals by delaying the timing control signals;
a first decoder coupled to the third delay circuit and configured to provide a first input timing signal by decoding the second input timing signals; and
a second decoder coupled to the counter circuit and configured to provide the first output timing signal by decoding the timing control signals.

8. The apparatus as claimed in claim 7, wherein the third delay circuit is configured to represent a first delay that is substantially constant.

9. The apparatus as claimed in claim 7, wherein
the first decoder is further configured to provide a third input timing signal by decoding the second input timing signals,
wherein the second decoder is further configured to provide a second output timing signal by decoding the timing control signals, and wherein the second circuit further comprises:
first and second input latch circuits coupled in common to the first circuit and configured to latch the second signal in response to the first input timing signal and the second input timing signal, respectively;
first and second output latch circuits coupled to the first and second input latch circuit and configured to output the third signal in response to the first output timing signal and the second output timing signal, respectively; and
a selector circuit including first and second input nodes coupled respectively to the first and second input latch circuits and first and second output nodes coupled respectively to the first and second output latch circuits, the selector circuit being configured to couple the first and second input latch circuits to the first and second output latch circuit in response to a selector control signal.

10. The apparatus as claimed in claim 9, further comprising:
a third circuit coupled to the second circuit and configured to provide the selector control signal in response to a latency information.

11. A method comprising:
providing a system clock signal;
latching command signals respective to the system clock signal;
providing a signal based on the command signals;
latching the signal responsive to the system clock signal; and
providing a clock-synchronized read signal responsive to latency information,
wherein the latency information used to provide the clock-synchronized read signal is a latency between the system clock signal and the clock-synchronized read signal, and the clock-synchronized read signal is provided based on both the command signals and the signal latched responsive to the system clock signal.

12. The method of claim 11, wherein the system clock signal is based on an external clock signal.

13. The method of claim 11, wherein the clock synchronized read signal is responsive to a shift cycle parameter responsive to the latency information.

14. The method of claim 11, wherein latching command signals responsive to the system clock signal comprises:
latching the command signals responsive a first clock signal responsive to the system clock signal;
providing a read signal or a write signal as an output signal responsive to a read command or a write command on the command signals;
latching the read signal or the write signal responsive to a second clock signal responsive to the first clock signal;
providing the latched read signal or the latched write signal as an internal signal;
latching the internal signal responsive to the second clock signal; and
providing an enable signal responsive to the latched internal signal.

15. The method of claim 14, wherein the providing the system clock signal comprises:
providing a reference clock signal responsive to the enable signal.

16. The method of claim 15, wherein providing the system clock signal comprises:
providing the reference clock signal and the system clock signal based on an external clock signal.

17. The method of claim 11, wherein latching the signal responsive to the system clock signal comprises:
- receiving the system clock signal;
- providing a plurality of first timing control signals responsive to the system clock signal,
- providing a plurality of second timing control signals that has a predetermined delay from the system clock signal; and
- providing pointer input signals by decoding the plurality of second timing control signals, and
- wherein providing the clock-synchronized read signal responsive to the latency information comprises:
- receiving the system clock signal and the plurality of first timing control signals; and
- providing pointer output signals by decoding the plurality of first timing control signals responsive to the system clock signal.

* * * * *